United States Patent
Tsuboi et al.

(10) Patent No.: US 9,437,648 B2
(45) Date of Patent: Sep. 6, 2016

(54) SOLID-STATE IMAGE PICKUP DEVICE

(71) Applicant: CANON KABUSHIKI KAISHA, Tokyo (JP)

(72) Inventors: Hiromasa Tsuboi, Tama (JP); Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/740,633

(22) Filed: Jun. 16, 2015

(65) Prior Publication Data

US 2015/0372048 A1 Dec. 24, 2015

(30) Foreign Application Priority Data

Jun. 24, 2014 (JP) ................... 2014-129535

(51) Int. Cl.
*H01L 27/00* (2006.01)
*H01L 27/146* (2006.01)

(52) U.S. Cl.
CPC ..... *H01L 27/14679* (2013.01); *H01L 27/1463* (2013.01); *H01L 27/14603* (2013.01); *H01L 27/14616* (2013.01)

(58) Field of Classification Search
CPC .................. H01L 27/14679; H01L 27/14616; H01L 27/14603; H01L 27/1463
See application file for complete search history.

(56) References Cited

U.S. PATENT DOCUMENTS

| | | | | |
|---|---|---|---|---|
| 5,847,381 A | * | 12/1998 | Isogai | H01L 27/14643 250/208.1 |
| 6,661,045 B2 | * | 12/2003 | Ishiwata | H01L 27/14603 257/222 |
| 7,728,895 B2 | * | 6/2010 | Tanaka | H01L 27/14603 348/302 |
| 2012/0261782 A1 | * | 10/2012 | Kobayashi | H01L 27/14627 257/432 |
| 2013/0032726 A1 | | 2/2013 | Totsuka | |
| 2014/0145287 A1 | * | 5/2014 | Kato | H01L 27/14621 257/432 |

FOREIGN PATENT DOCUMENTS

JP 2004-158508 A 6/2004

* cited by examiner

*Primary Examiner* — Nikolay Yushin
(74) *Attorney, Agent, or Firm* — Canon USA, Inc. I.P. Division

(57) ABSTRACT

A solid-state image pickup device includes a plurality of pixels each including a photoelectric conversion section that generates an electric charge in accordance with incident light and a junction field-effect transistor that outputs an image signal in accordance with the electric charge generated by the photoelectric conversion section. The solid-state image pickup device includes a first element isolation region using an insulator and a second element isolation region using a pn junction, the first element isolation region and the second element isolation region being arranged in a region in which the plurality of pixels are arranged.

15 Claims, 10 Drawing Sheets

SOLID-STATE IMAGE PICKUP DEVICE

BACKGROUND OF THE INVENTION

1. Field of the Invention

The present invention relates to a solid-state image pickup device.

2. Description of the Related Art

A junction field-effect transistor (hereinafter called a "JFET") is used as a transistor for signal amplification in a pixel of a Complementary Metal-Oxide-Semiconductor ("CMOS") image sensor, which is a solid-state image pickup device. It is known that, by using a JFET, a signal charge is kept from being caught by an interface state during an amplification operation, whereby noise can be reduced.

In Japanese Patent Laid-Open No. 2004-158508 (hereinafter called "Patent Document 1"), the drain region of a JFET is formed in a region surrounding a photoelectric conversion element, and also serves as an isolation region between neighboring photoelectric conversion elements. The Patent Document 1 refers to disuse of an insulator in the isolation region as a technical advantage.

SUMMARY OF THE INVENTION

A solid-state image pickup device of an embodiment includes a plurality of pixels each including a photoelectric conversion section that generates an electric charge in accordance with incident light; and a junction field-effect transistor that outputs an image signal in accordance with the electric charge generated by the photoelectric conversion section. The solid-state image pickup device includes a first element isolation region using an insulator and a second element isolation region using a pn junction, the first element isolation region and the second element isolation region being arranged in a region in which the plurality of pixels are arranged.

According to other aspects of the present inventions, one or more additional solid-state image pickup devices are discussed herein. Further features of the present invention will become apparent from the following description of exemplary embodiments with reference to the attached drawings.

DESCRIPTION OF THE EMBODIMENTS

According to the embodiments, at least one solid-state image pickup device is realized which can reduce noise in a pixel signal that is output from a photo-electric conversion section.

An electric charge is generated by impact ionization in the vicinity of a drain region of a JFET or a reset transistor. This electric charge intrudes into a photo-electric conversion section through a diffusion layer (drain region of a JFET) which is a neutral region. As a result, noise is generated in a pixel signal. Impact ionization is more likely to be generated when a high electric field is applied to a pn junction. When there are many element isolations based on pn junctions, it becomes more likely that the impact ionization described above is generated.

The above-described noise can be reduced according to the embodiments.

First Embodiment

Figure 1:
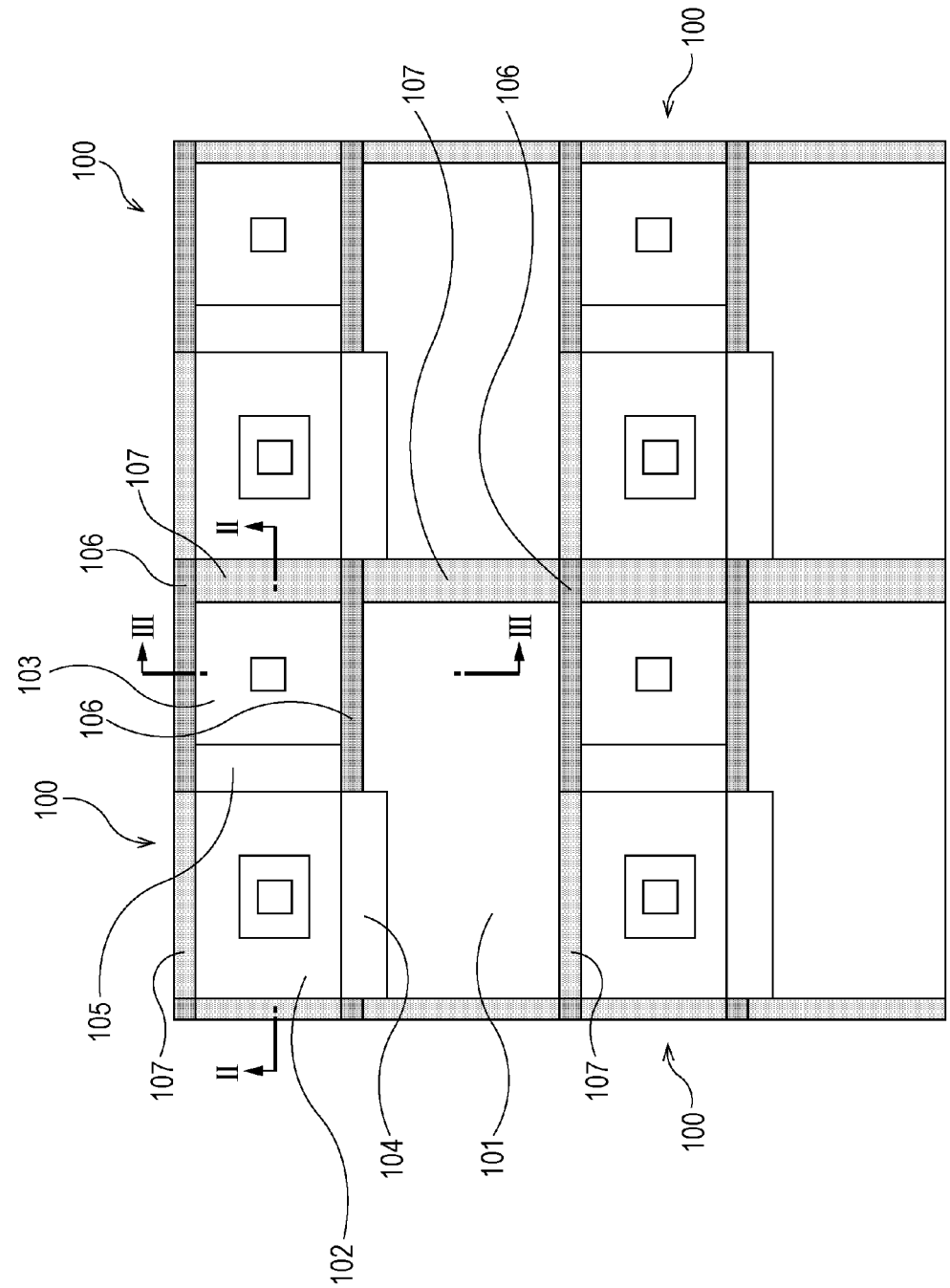
FIG. 1 is a schematic plan view illustrating the configuration of a solid-state image pickup device according to a first embodiment.
Figure 2:
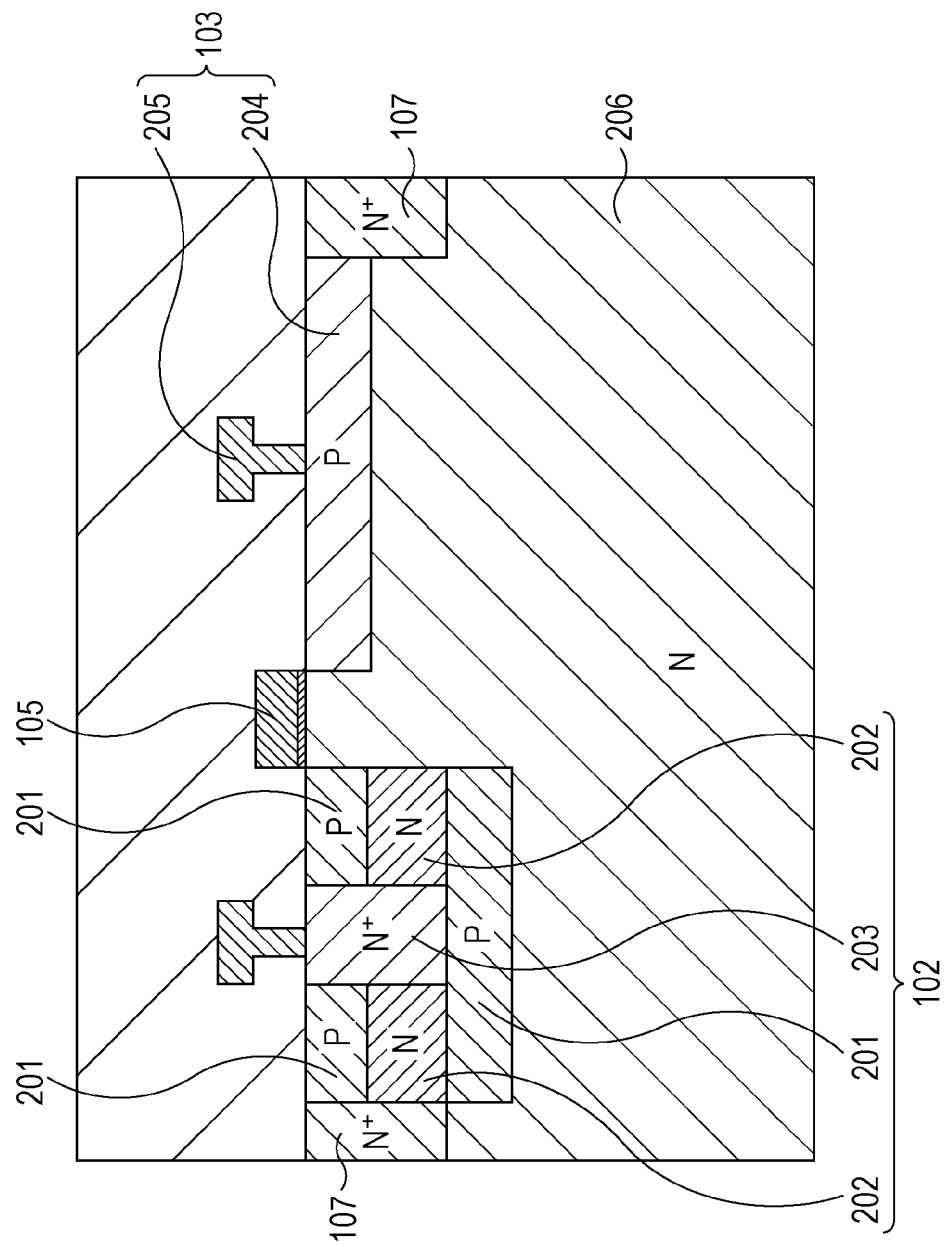
FIG. 2 is a schematic sectional view taken along line II-II in FIG. 1 illustrating the configuration of the solid-state image pickup device according to the first embodiment.
Figure 3:
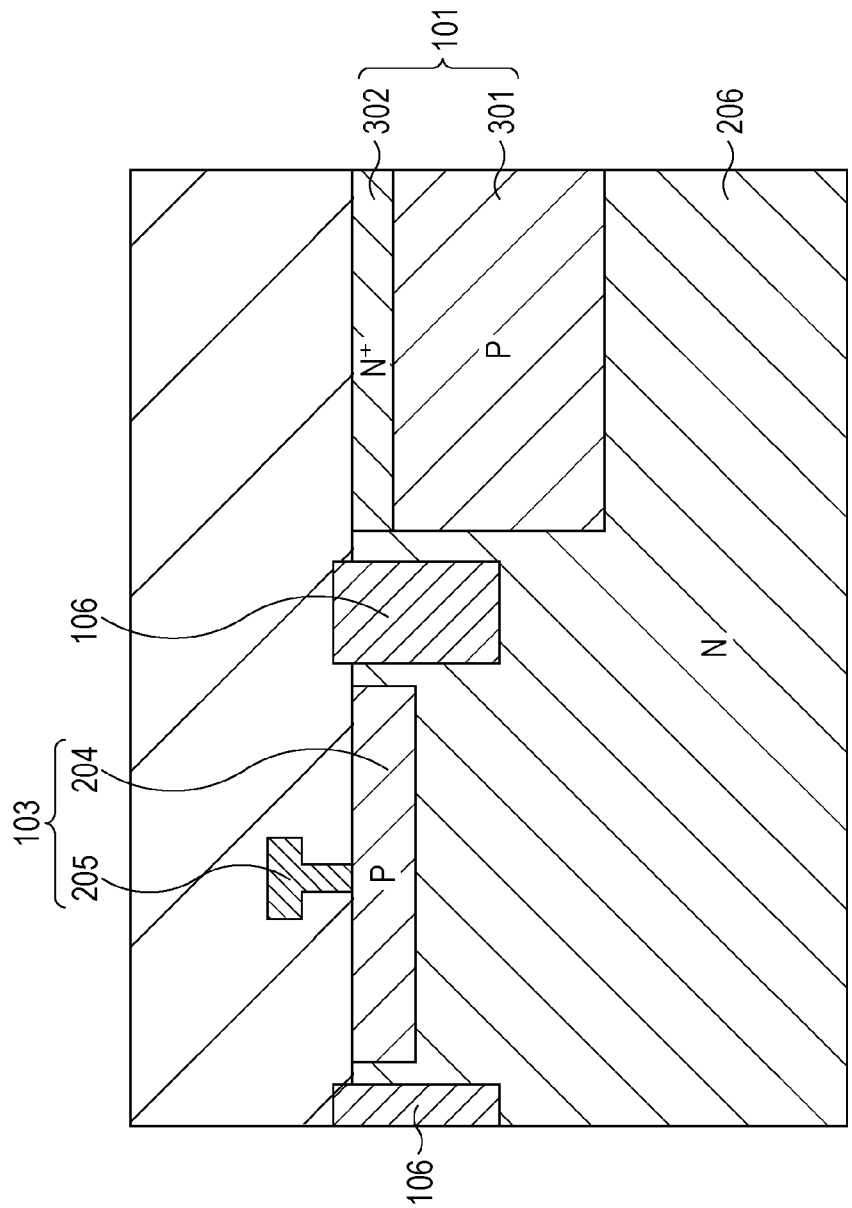
FIG. 3 is a schematic sectional view taken along line III-III in FIG. 1 illustrating the configuration of the solid-state image pickup device according to the first embodiment.

FIG. 1 to FIG. 3 are schematic diagrams illustrating the configuration of a solid-state image pickup device according to a first embodiment. FIG. 1 is a plan view, FIG. 2 is a sectional view taken along line II-II in FIG. 1, and FIG. 3 is a sectional view taken along line III-III in FIG. 1.

Referring to FIG. 1, a solid-state image pickup device includes a plurality of pixels 100 formed therein. A pixel 100 includes a photoelectric conversion section 101 that generates and stores an electric charge in accordance with incident light and a lateral JFET 102 that receives, amplifies, and outputs the electric charge stored in the photoelectric conversion section 101.

The pixel 100 includes a drain section 103 of a reset transistor, a gate electrode 104 of a transfer transistor, and a gate electrode 105 of a reset transistor.

The gate electrode 104 is a gate electrode of the transfer transistor that transfers an electric charge generated and stored in the photoelectric conversion section 101 to the JFET 102. The drain section 103 is the drain section of the reset transistor (which resets an electric charge stored in the gate section of the JFET 102) for discharging the electric charge transferred to the JFET 102. The gate electrode 105 is the gate electrode of the reset transistor that controls the drain section 103 of the reset transistor.

The pixels 100 are isolated from each other by using both at least one first element isolation region that uses an insulator and at least one second element isolation region that uses a pn junction, and this is a characteristic of the present embodiment. The at least one first element isolation region is formed of, for example, shallow trench isolation (STI) isolation or local oxidation of silicon (LOCOS) isolation, and will hereinafter be called an insulator isolation region (or regions) 106. The at least one second element isolation region itself is an n-type impurity region and forms a pn junction together with a p-type impurity region, which is a neighboring structure, and will hereinafter be called an n-type isolation region (or regions) 107. Alternatively, in one or more embodiments, the second element isolation region(s) 107 may itself be a p-type impurity region and form a pn junction together with an n-type impurity region, which is a neighboring structure.

FIG. 2 illustrates a sectional structure of the JFET 102 and the drain section 103 of the reset transistor. The JFET 102 includes p-type gate regions 201 formed in an n-type well layer 206, an n-type source region 203 formed within the p-type gate regions 201, and an n-type channel region 202 sandwiched by the p-type gate regions 201 in the vertical direction (and/or on opposite sides of the n-type channel region 202).

The n-type channel region 202 of the JFET 102 is electrically connected to the n-type well layer 206 and the n-type isolation region(s) 107. By applying a predetermined voltage to the gate electrode 104 of the transfer transistor formed on the n-type well layer 206 through a gate insulating film, the electric charge stored in the photoelectric conversion section 101 is transferred to the gate region 201 and output after amplification. During the operation of the JFET 102, an ON current of the JFET 102 flows to the n-type source region 203 of the JFET 102 through the n-type well layer 206 and the n-type isolation region(s) 107. In other words, the n-type well layer 206 and the n-type isolation region(s) 107 function as the drain region of the JFET 102.

The drain section 103 of the reset transistor includes a contact portion 205 and a p-type semiconductor region 204 and has a function of discharging the electric charge transferred to the JFET 102. Further, in one or more embodiments, the drain section 103 of the reset transistor and the n-type channel region 202 of the JFET 102 may be provided in such a manner that the n-type isolation region(s) 107 is/are sandwiched therebetween. In one or more embodiments, an n-type isolation region 107 may be sandwiched between a drain section 103 of a reset transistor (e.g., of one pixel 100) and an n-type channel region 202 of a JFET 102 (e.g., of another pixel 100) (see structure shown in FIGS. 1-2). By employing such a configuration, in a pinch-off region within the n-type channel region 202 of the JFET 102, a surplus electric charge generated by impact ionization is discharged to the drain section 103 of the reset transistor.

FIG. 3 illustrates a sectional structure of the photoelectric conversion section 101 and the drain section 103 of the reset transistor. The photoelectric conversion section 101 is formed of a p-type charge accumulation region 301 formed in the n-type well layer 206 and a high-concentration n-type semiconductor region 302 formed near the semiconductor surface of the upper portion (or a side portion, a side portion facing away from the well layer 206, etc.) of the p-type charge accumulation region 301. The photoelectric conversion section 101 generates and stores an electric charge in accordance with incident light.

In the present embodiment, the insulator isolation region(s) 106 and the n-type isolation region(s) 107 are used for element isolation in the pixels 100, as described above.

At least one insulator isolation region 106 (as shown in FIG. 3) is used for element isolation between the photoelectric conversion section(s) 101 and the drain section(s) 103 of the reset transistor(s) neighboring each other (e.g., between respective, neighboring drain section(s) 103 and photoelectric conversion section(s) 101 of one or more pixels 100).

At least one n-type isolation region 107 is used for element isolation between the JFET(s) 102 and the drain section(s) 103 of the reset transistor(s) neighboring each other (e.g., between respective, neighboring JFET(s) 102 and drain section(s) 103 of one or more pixels 100) (e.g., across pixels 100).

At least one n-type isolation region 107 is used for element isolation between the photoelectric conversion section(s) 101 and the JFET(s) 102 neighboring each other (e.g., between respective, neighboring JFET(s) 102 and photoelectric conversion section(s) 101 of one or more pixels 100) (e.g., across pixels 100).

At least one n-type isolation region 107 is used for element isolation between the photoelectric conversion sections 101 neighboring each other (e.g., across pixels 100).

In the isolation between elements described above, two elements isolated by the insulator isolation region(s) 106 or the n-type isolation region(s) 107 are those positioned in the same pixel 100 or respectively positioned in the pixels 100 neighboring each other (e.g., across pixels 100).

The n-type isolation region(s) 107, the n-type channel region(s) 202, the n-type source region(s) 203, the n-type well layer(s) 206, and the n-type semiconductor region(s) 302 are formed by ion implantation or thermal diffusion of phosphorus (P), arsenic (As), or the like, which are n-type impurities.

For example, to form the n-type isolation region(s) 107 by using ion implantation, by forming and using a resist mask that has an opening corresponding to an area where the n-type isolation region(s) 107 will be formed within an area for element isolation, ion implantation of a predetermined dosage of n-type impurity is performed with predetermined acceleration energy. Similarly, the n-type channel region(s) 202, the n-type source region(s) 203, the n-type well layer(s) 206, and the n-type semiconductor region(s) 302 are each formed by ion implantation of a predetermined dosage of n-type impurity performed with predetermined acceleration energy, using a resist mask that has an opening for a region to be formed. The resist masks after use are removed by ashing processing or wet processing.

The p-type gate region(s) 201, the p-type semiconductor region(s) 204, and the p-type charge accumulation region(s) 301 are formed by ion implantation or thermal diffusion of boron (B), which is a p-type impurity.

For example, to form the p-type gate region(s) 201 by using ion implantation, by forming and using a resist mask that has an opening corresponding to an area where the p-type gate region(s) 201 will be formed, ion implantation of a predetermined dosage of p-type impurity is performed with predetermined acceleration energy. Similarly, the p-type semiconductor region(s) 204, and the p-type charge accumulation region(s) 301 are each formed by ion implantation of a predetermined dosage of p-type impurity performed with predetermined acceleration energy, using a resist mask that has an opening for a region to be formed. The resist masks after use are removed by ashing processing or wet processing.

Since predetermined potentials are applied to the p-type semiconductor region(s) 204 and the n-type well layer(s) 206, an electric field is generated across the PN junction formed of at least one p-type semiconductor region 204 and at least one n-type well layer 206. This electric field causes impact ionization to be generated, whereby a surplus electric charge is generated. When n-type diffusion layer isolation which utilizes a pn junction is used as element isolation between the photoelectric conversion section(s) 101 and the drain section(s) 103 of the reset transistor(s) neighboring each other, an electric charge generated by the impact ionization may intrude into the p-type charge accumulation region(s) 301 through the n-type diffusion layer.

Thus, in the present embodiment, an insulator isolation region(s) 106 is/are used rather than the n-type diffusion layer isolation, for the element isolation between the photoelectric conversion section(s) 101 and the drain section(s) 103 of the reset transistor(s) neighboring each other (e.g., between respective, neighboring drain section(s) 103 and photoelectric conversion section(s) 101 of one or more pixels 100). Hence, the electric charge generated by impact ionization intruding into the p-type charge accumulation region 301 is reliably suppressed. In this manner, in the present embodiment, a reliable solid state image pick up device is realized which considerably reduces the noise of an image signal output from the photoelectric conversion section(s) 101.

Second Embodiment

Figure 4:
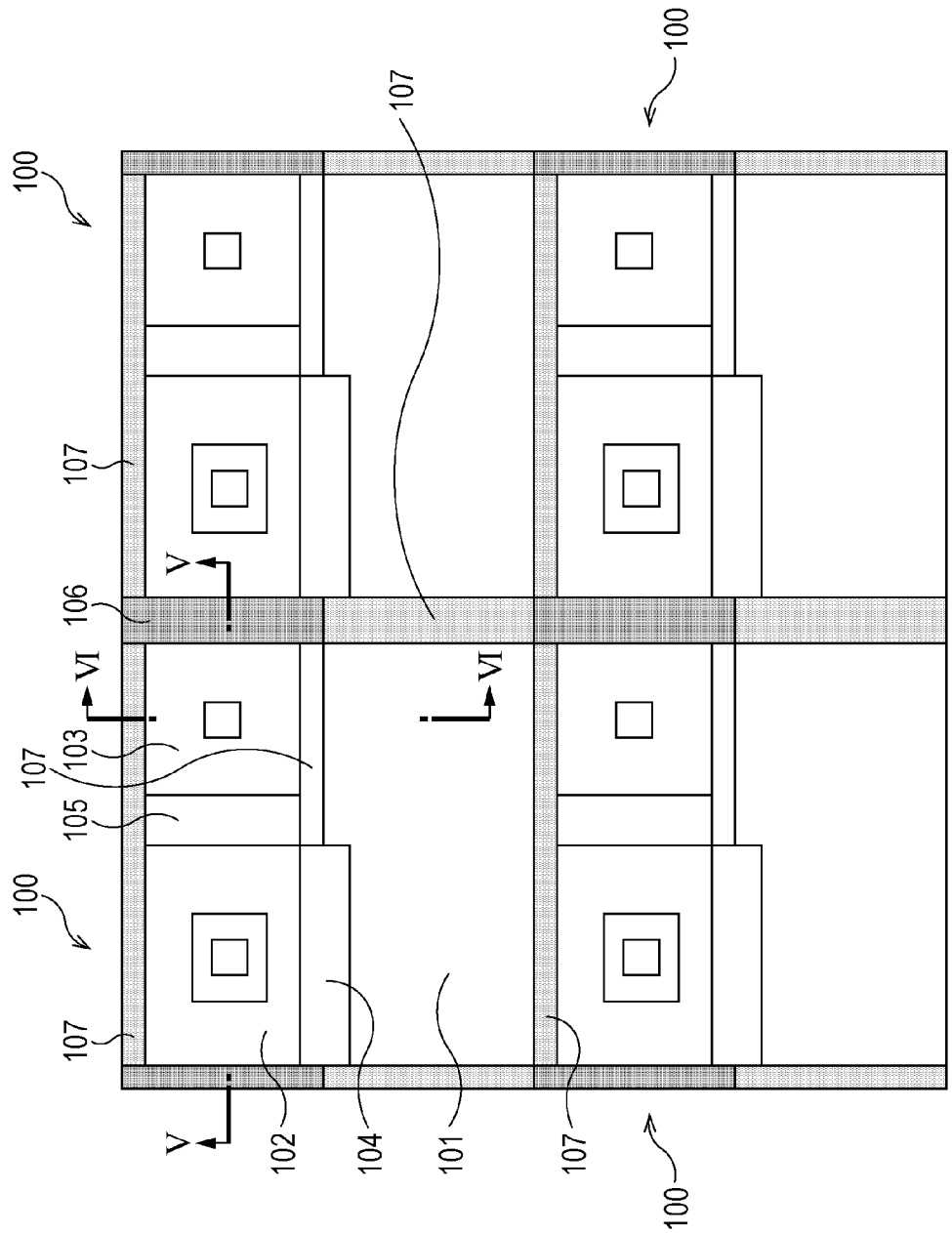
FIG. 4 is a schematic plan view illustrating the configuration of a solid-state image pickup device according to a second embodiment.
Figure 5:
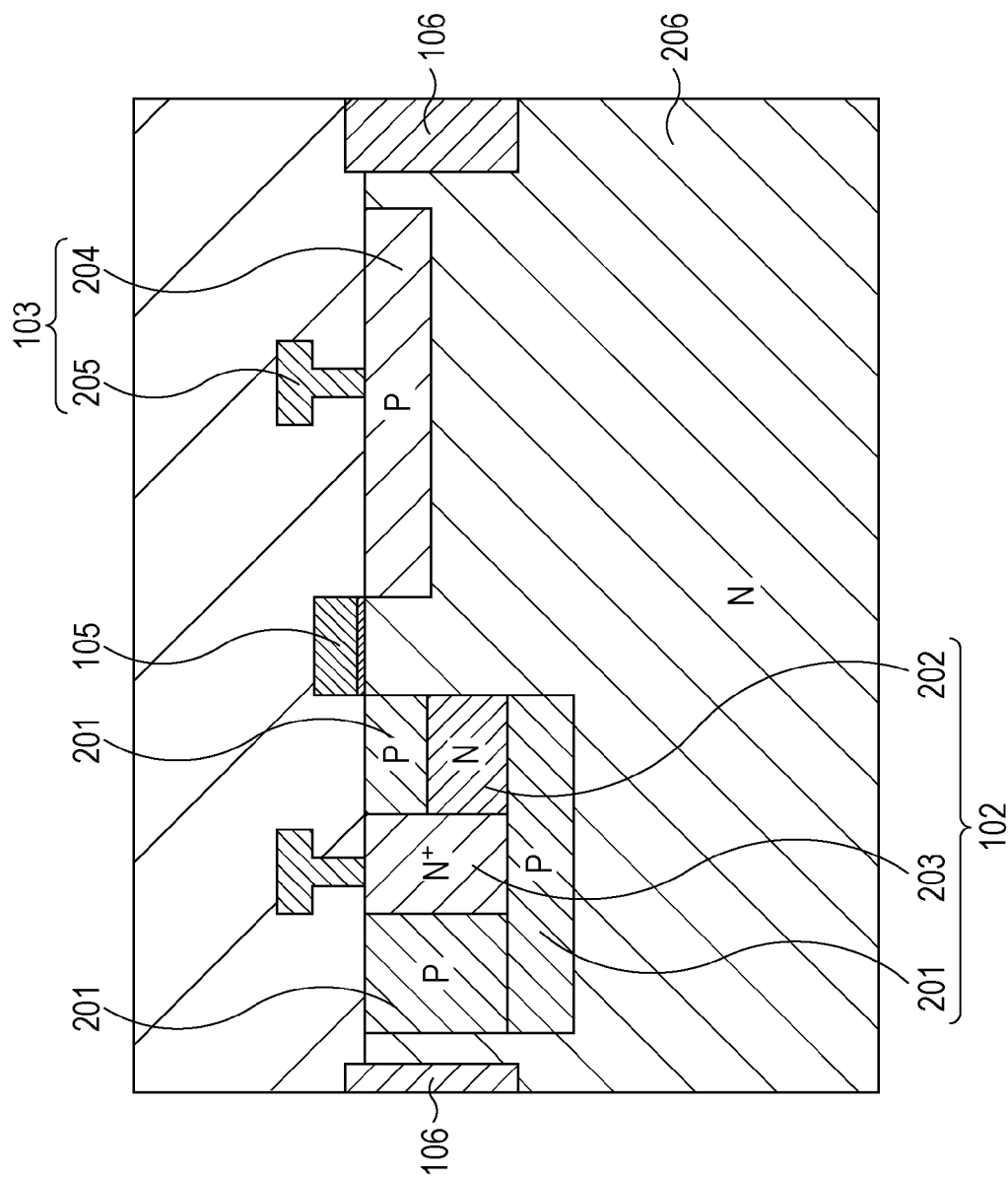
FIG. 5 is a schematic sectional view taken along line V-V in FIG. 4 illustrating the configuration of the solid-state image pickup device according to the second embodiment.
Figure 6:
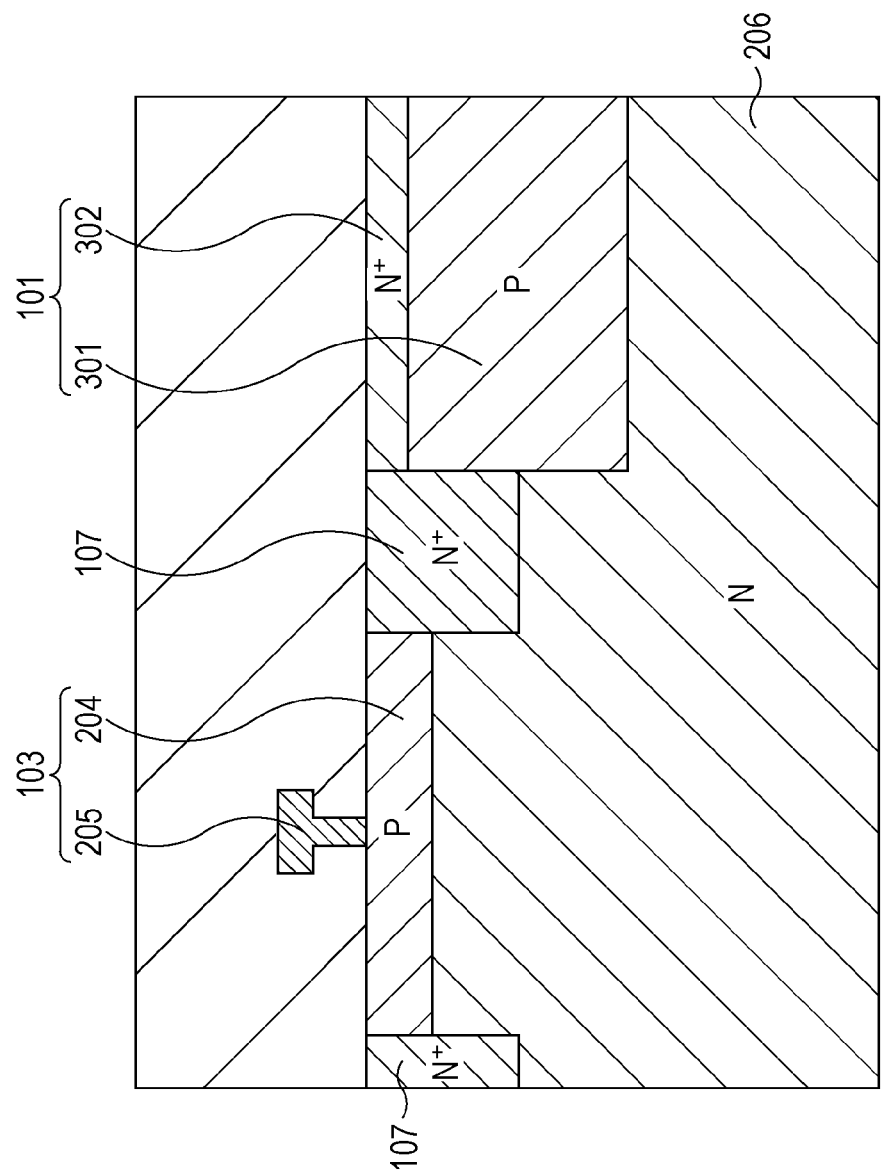
FIG. 6 is a schematic sectional view taken along line VI-VI in FIG. 4 illustrating the configuration of the solid-state image pickup device according to the second embodiment.

FIG. 4 to FIG. 6 are schematic diagrams illustrating the configuration of a solid state image capturing device according to a second embodiment. FIG. 4 is a plan view, FIG. 5 is a sectional view taken along line V-V in FIG. 4, and FIG. 6 is a sectional view taken along line VI-VI in FIG. 4. In FIG. 4 to FIG. 6, configuration members which are the same as those described in the first embodiment are denoted by the same reference symbols and detailed descriptions thereof are omitted.

The present embodiment is different from the first embodiment mainly in terms of positions at which the insulator isolation region(s) 106 and the n-type isolation region(s) 107 used for element isolation in the pixels 100 are formed.

Unlike the first embodiment, the n-type isolation region(s) 107 is/are used for element isolation between the photoelectric conversion section(s) 101 and the drain section(s) 103 of the reset transistor(s) neighboring each other (e.g., between respective, neighboring drain section(s) 103 and photoelectric conversion section(s) 101 of one or more pixels 100) (see e.g., FIGS. 4 and 6).

Unlike the first embodiment, the insulator isolation region(s) 106 is/are used for element isolation between the JFET(s) 102 and the drain section(s) 103 of the reset transistor(s) neighboring each other (e.g., between respective, neighboring JFET(s) 102 and drain section(s) 103 of one or more pixels 100) (see e.g., FIGS. 4 and 5).

Similarly to the first embodiment, the n-type isolation region(s) 107 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100) (see e.g., FIG. 4).

Similarly to the first embodiment, the n-type isolation region(s) 107 is/are used for element isolation between the photoelectric conversion sections 101 neighboring each other (see e.g., FIG. 4).

In the isolation between elements described above, the two elements isolated by the insulator isolation region(s) 106 or the n-type isolation region(s) 107 are those positioned in the same pixel 100 or respectively positioned in the pixels 100 neighboring each other (e.g., across pixels 100).

In the present embodiment, as described above, an insulator isolation region(s) 106, rather than n-type diffusion layer isolation, is/are used for element isolation between the JFET(s) 102 and the drain section(s) 103 of the reset transistor(s) neighboring each other (e.g., between respective, neighboring JFET(s) 102 and drain section(s) 103 of one or more pixels 100). Hence, the electric charge generated by impact ionization between the p-type semiconductor region 204 and the n-type well layer 206 intruding into the p-type gate region 201 of the JFET(s) 102 is reliably suppressed. In this manner, in the present embodiment, a reliable solid state image pick up device is realized which considerably reduces noise of an image signal output from the photoelectric conversion section(s) 101.

Third Embodiment

Figure 7:
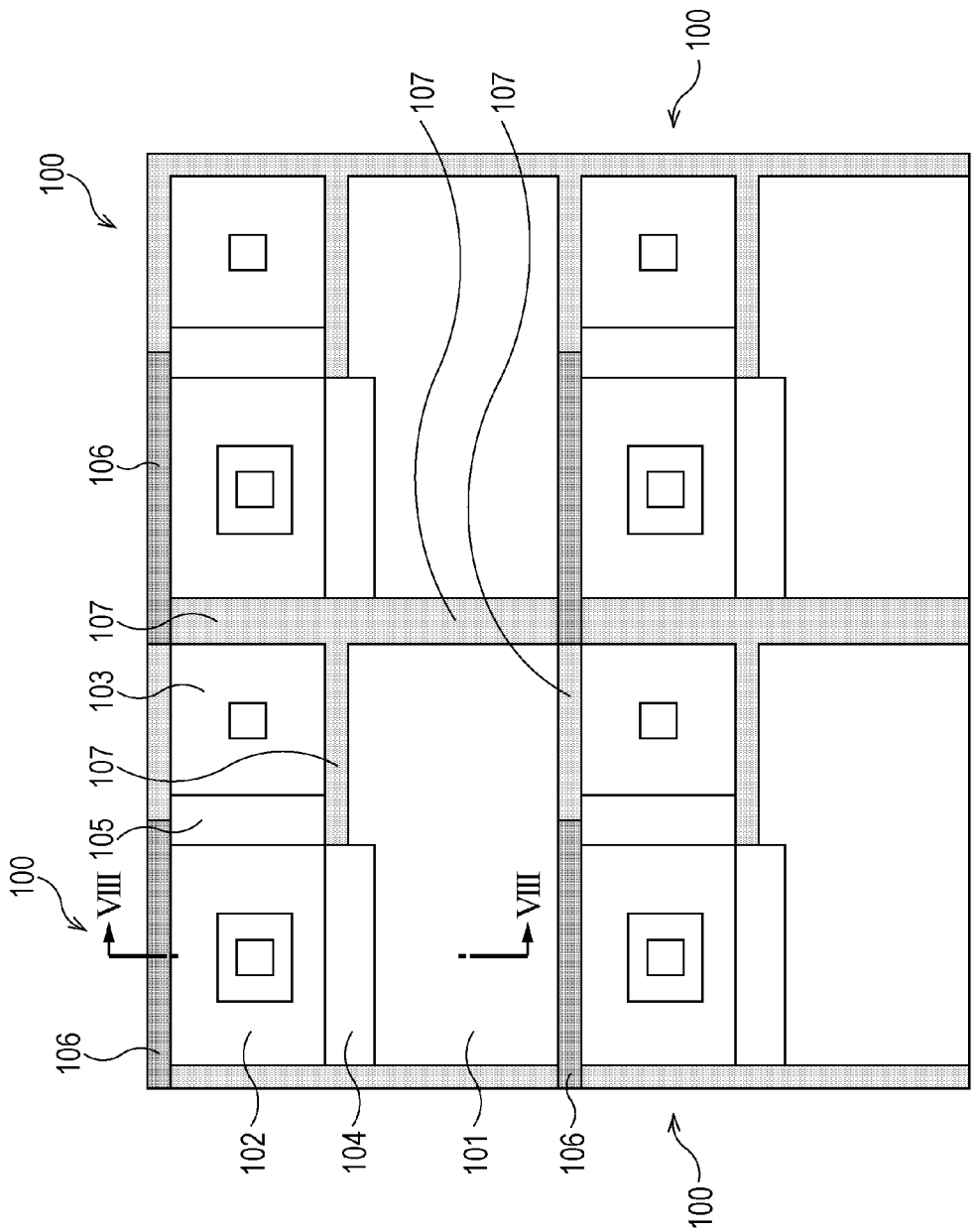
FIG. 7 is a schematic plan view illustrating the configuration of a solid-state image pickup device according to a third embodiment.
Figure 8:
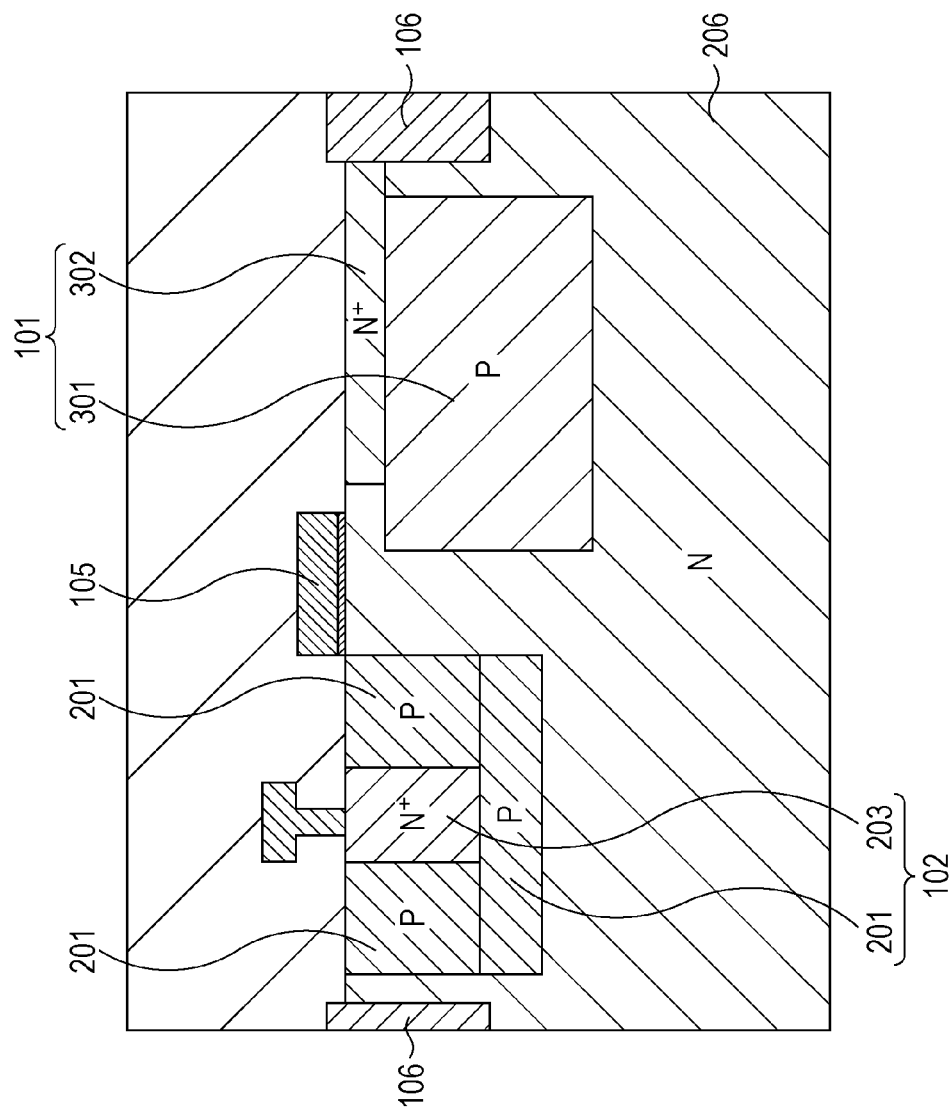
FIG. 8 is a schematic sectional view taken along line VIII-VIII in FIG. 7 illustrating the configuration of the solid-state image pickup device according to the third embodiment.

FIG. 7 to FIG. 8 are schematic diagrams illustrating the configuration of a solid state image capturing device according to a third embodiment. FIG. 7 is a plan view and FIG. 8 is a sectional view taken along line VIII-VIII in FIG. 7. In FIG. 7 and FIG. 8, configuration members which are the same as those described in the first embodiment and/or the second embodiment are denoted by the same reference symbols and detailed descriptions thereof are omitted.

The present embodiment is different from the first embodiment mainly in terms of positions at which the insulator isolation region(s) 106 and the n-type isolation region(s) 107 used for element isolation in the pixels 100 are formed.

Unlike the first embodiment, the n-type isolation region(s) 107 is/are used for element isolation between the photoelectric conversion section(s) 101 and the drain sections 103 of the reset transistor(s) neighboring each other e.g., between respective, neighboring photoelectric conversion section(s) 101 and drain section(s) 103 of one or more pixels 100) (see e.g., FIG. 7).

Similarly to the first embodiment, the n-type isolation region(s) 107 is/are used for element isolation between the JFET(s) 102 and the drain section(s) 103 of the reset transistor(s) neighboring each other (e.g., between respective, neighboring JFET(s) 102 and drain section(s) 103) (see e.g., FIG. 7).

Unlike the first embodiment, the insulator isolation region(s) 106 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100) (see e.g., FIGS. 7 and 8).

Similarly to the first embodiment, the n-type isolation region(s) 107 is/are used for element isolation between the photoelectric conversion sections 101 neighboring each other (see e.g., FIG. 7).

In the isolation between elements described above, the two elements isolated by the insulator isolation region(s) 106 or the n-type isolation region(s) 107 are those positioned in the same pixel 100 or respectively positioned in the pixels 100 neighboring each other (e.g., across pixels 100).

During the operation of at least one JFET 102, a high electric field is generated in the pinch-off region within the n-type channel region 202 of the JFET 102 (see e.g., FIG. 2 and/or FIG. 5), and a surplus electric charge is generated due to impact ionization. When n-type diffusion isolation is used for element isolation between the photoelectric conversion section(s) 101 and the JFET(s) 102 neighboring each other (e.g., between respective, neighboring JFET(s) 102 and photoelectric conversion section(s) 101 of one or more pixels 100), the electric charge generated due to impact ionization may intrude into the p-type charge accumulation region 301 through the n-type isolation region 107.

In the present embodiment, as described above, the insulator isolation region(s) 106 rather than n-type diffusion layer isolation is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100). Hence, the electric charge generated due to impact ionization within the n-type channel region 202 of the JFET 102 intruding into the p-type charge accumulation region 301 is reliably suppressed. In this manner, in the present embodiment, a reliable solid state image pick up device is realized which considerably reduces noise of an image signal output from the photoelectric conversion section(s) 101.

Fourth Embodiment

Figure 9:
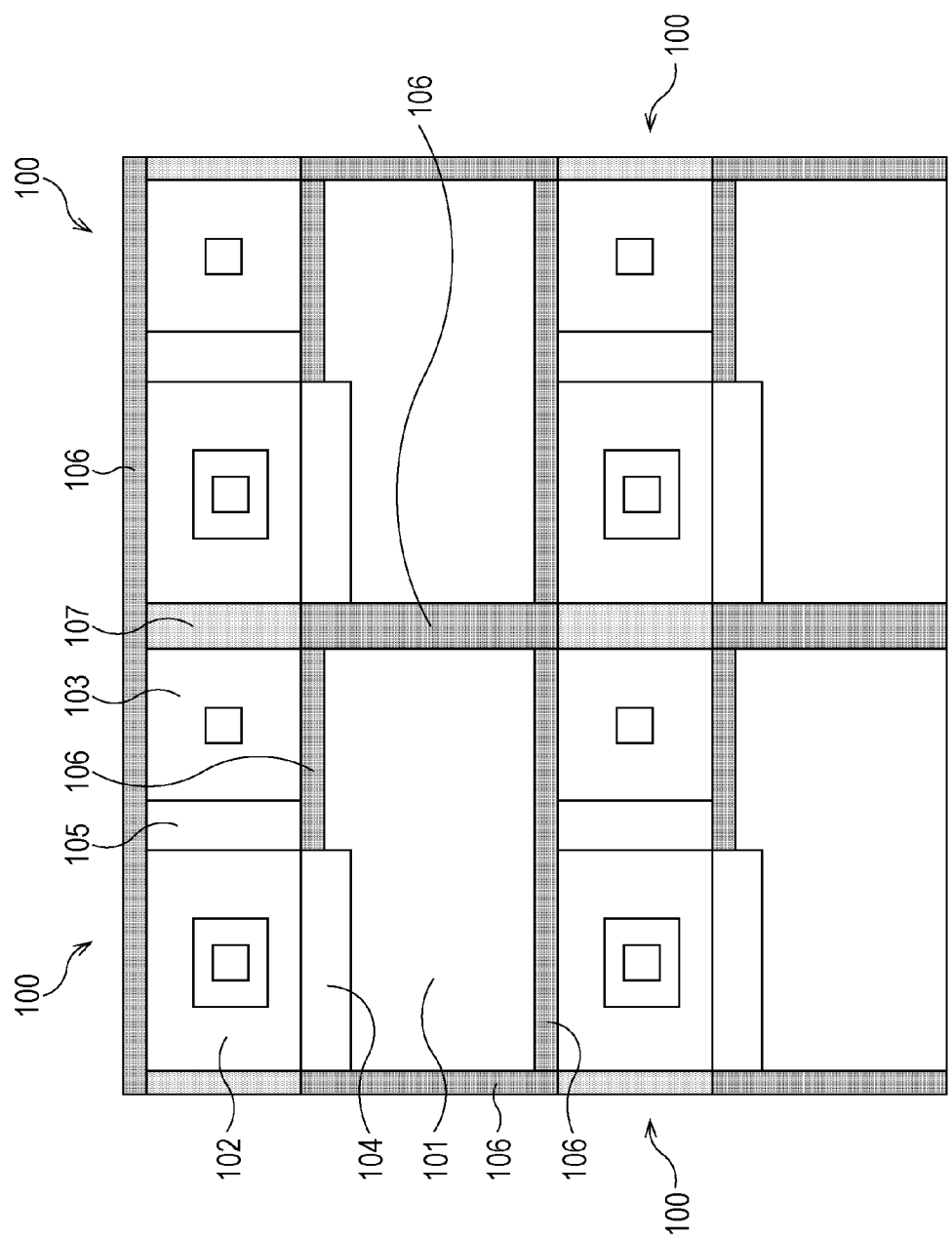
FIG. 9 is a schematic plan view illustrating the configuration of a solid-state image pickup device according to a fourth embodiment.

FIG. 9 is a schematic plan view illustrating the configuration of an image pickup device according to a fourth embodiment. In FIG. 9, configuration members similar to those described in the first to third embodiments are denoted by the same reference symbols and the detailed descriptions thereof are omitted.

The present embodiment is different from the first embodiment mainly in terms of positions at which the insulator isolation region(s) 106 and the n-type isolation region(s) 107 used for element isolation in the pixels 100 are formed.

Similarly to the first embodiment, the insulator isolation region(s) 106 is/are used for element isolation between the photoelectric conversion section(s) 101 and the drain section(s) 103 of the reset transistor(s) neighboring each other (e.g., between respective, neighboring drain section(s) 103 and photoelectric conversion section(s) 101 of one or more pixels 100).

Similarly to the first embodiment, the n-type isolation region(s) 107 is/are used for element isolation between the JFET(s) 102 and the drain section(s) 103 of the reset transistor(s) neighboring each other (e.g., between respective, neighboring JFET(s) 102 and drain section(s) 103 of one or more pixels 100).

Unlike the first embodiment, the insulator isolation region(s) 106 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100).

Unlike the first embodiment, the insulator isolation region(s) 106 is/are used for element isolation between the photoelectric conversion sections 101 neighboring each other (e.g., across pixels 100).

In the isolation between elements described above, the two elements isolated by the insulator isolation region(s) 106 or the n-type isolation region(s) 107 are those positioned in the same pixel 100 or respectively positioned in the pixels 100 neighboring each other (e.g., across pixels 100).

In the present embodiment, as a result of the manner in which the above-described element isolation is formed, a configuration is employed in which the photoelectric conversion section(s) 101 is/are surrounded by the insulator isolation regions 106 and a gate electrode 104 of a transfer transistor. Hence, an electric charge generated by impact ionization in the n-type channel region 202 of the JFET 102 and between the p-type semiconductor region 204 and the n-type well layer 206 intruding into the p-type charge accumulation region 301 and the p-type gate region 201 of the JFET 102 is reliably suppressed. In this manner, in the present embodiment, a highly reliable image pickup device is realized that considerably reduces noise in a pixel signal output from the photoelectric conversion section(s) 101. Further, color mixture among neighboring pixels 100 is suppressed.

Note that, for example, the following manners in which element isolation is realized may be conceived other than the present embodiment, in the present inventions.

1. Other Manner 1

The insulator isolation region(s) 106 is/are used for isolating the photoelectric conversion section(s) 101 and the drain section(s) 103 of a reset transistor(s) neighboring each other (e.g., between respective, neighboring drain section(s) 103 and photoelectric conversion section(s) 101 of one or more pixels 100).

The insulator isolation region(s) 106 is/are used for element isolation between the JFET(s) 102 and the drain section(s) 103 of the reset transistor(s) neighboring each other (e.g., between respective, neighboring JFET(s) 102 and drain section(s) 103 of one or more pixels 100).

The n-type isolation region(s) 107 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100).

The insulator isolation region(s) 106 or the n-type isolation region(s) 107 is/are used for element isolation between the photoelectric conversion sections 101 neighboring each other.

2. Other Manner 2

The n-type isolation region(s) 107 is/are used for element isolation between the photoelectric conversion section(s) 101 and the drain section(s) 103 of a reset transistor(s) neighboring each other (e.g., between respective, neighboring drain section(s) 103 and photoelectric conversion section(s) 101 of one or more pixels 100).

The insulator isolation region(s) 106 is/are used for element isolation between the JFET(s) 102 and the drain section(s) 103 of the reset transistor(s) neighboring each other (e.g., between respective, neighboring JFET(s) 102 and drain section(s) 103 of one or more pixels 100).

The insulator isolation region(s) 106 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100).

The insulator isolation region(s) 106 or the n-type isolation region(s) 107 is/are used for element isolation between the photoelectric conversion sections 101 neighboring each other.

Fifth Embodiment

Figure 10:
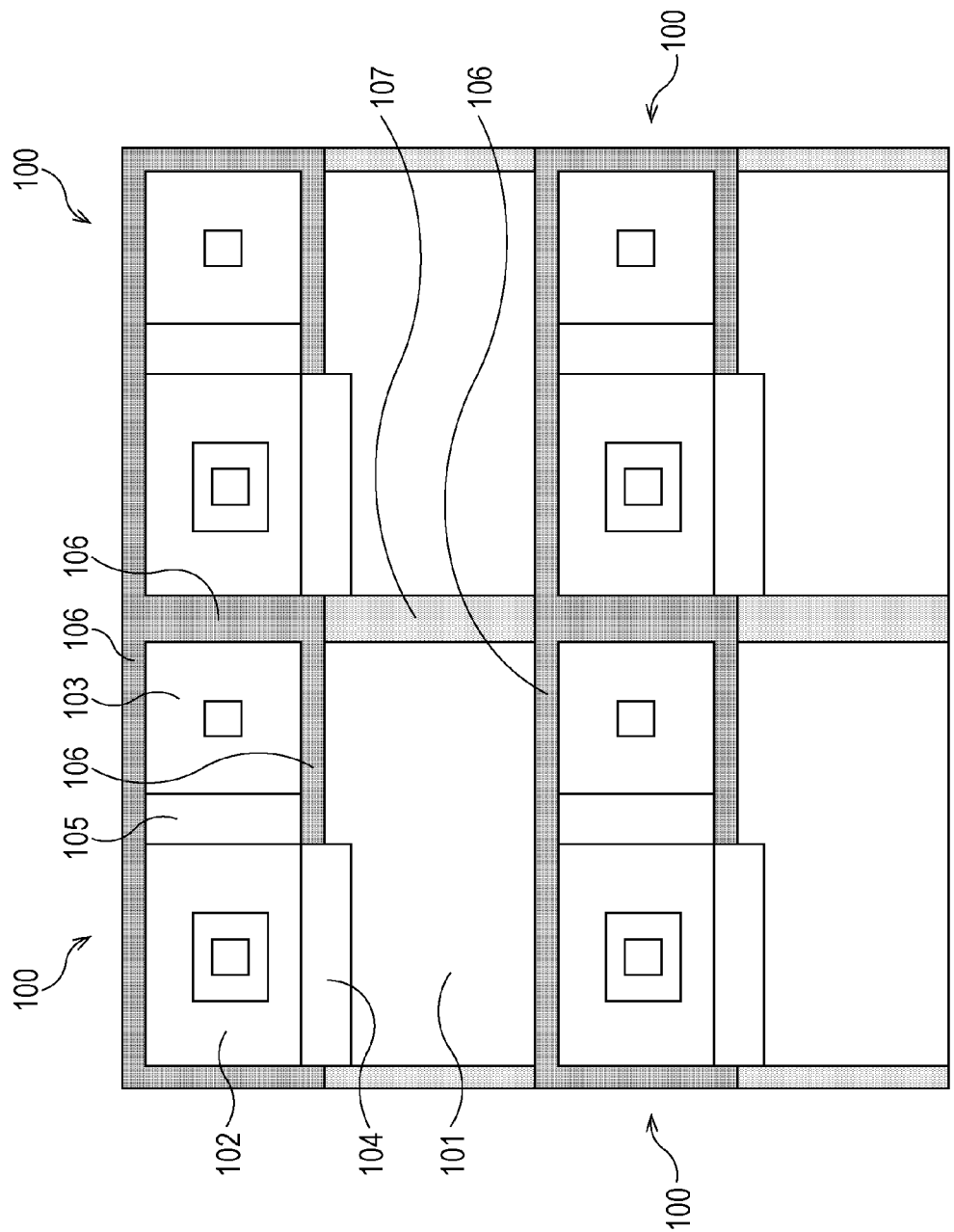
FIG. 10 is a schematic plan view illustrating the configuration of a solid-state image pickup device according to a fifth embodiment.

FIG. 10 is a schematic plan view illustrating the configuration of an image pickup device according to a fifth embodiment. In FIG. 10, configuration members similar to those described in the first to fourth embodiments are denoted by the same reference symbols and the detailed descriptions thereof are omitted.

In the present embodiment, in isolation between elements, a configuration is employed in which all the manners, in the first to third embodiments, in which the insulator isolation region(s) 106 is/are formed are combined.

Similarly to the first embodiment, the insulator isolation region(s) 106 is/are used for element isolation between the photoelectric conversion section(s) 101 and the drain section(s) 103 of a reset transistor(s) neighboring each other (e.g., between respective, neighboring drain section(s) 103 and photoelectric conversion section(s) 101 of one or more pixels 100).

Similarly to the second embodiment, the insulator isolation region(s) 106 is/are used for element isolation between the JFET(s) 102 and the drain section(s) 103 of the reset transistor(s) neighboring each other (e.g., between respective, neighboring JFET(s) 102 and drain section(s) 103 of one or more pixels 100).

Similarly to the third embodiment, the insulator isolation region(s) 106 is/are used for element isolation between the photoelectric conversion section(s) 101 and the JFET(s) 102 neighboring each other (e.g., between respective, neighboring JFET(s) 102 and photoelectric conversion section(s) 101 of one or more pixels 100).

Similarly to the first embodiment, the n-type isolation region(s) 107 is/are used for element isolation between the photoelectric conversion sections 101 neighboring each other (e.g., across pixels 100).

In the isolation between elements described above, the two elements isolated by the insulator isolation region(s) 106 or the n-type isolation region(s) 107 are those positioned in the same pixel 100 or respectively positioned in the pixels 100 neighboring each other (e.g., across pixels 100).

In the present embodiment, an electric charge generated by impact ionization in the n-type channel region 202 of the JFET 102 and between the p-type semiconductor region 204, the n-type well layer 206 intruding into the p-type charge accumulation region 301 and the p-type gate region 201 of the JFET 102 is reliably suppressed. In this manner, in the present embodiment, a highly reliable image pickup device is realized that considerably reduces noise in a pixel signal output from the photoelectric conversion section 101.

While the present inventions have been described with reference to exemplary embodiments, it is to be understood that the inventions are not limited to the disclosed exemplary embodiments. The scope of the following claims is to be accorded the broadest interpretation so as to encompass all such modifications and equivalent structures and functions.

This application claims the benefit of Japanese Patent Application No. 2014-129535, filed Jun. 24, 2014, which is hereby incorporated by reference herein in its entirety.

What is claimed is:

1. A solid-state image pickup device comprising:
a plurality of pixels each including:
a photoelectric conversion section that generates an electric charge in accordance with incident light; and
a junction field-effect transistor that outputs an image signal in accordance with the electric charge generated by the photoelectric conversion section,
wherein the solid-state image pickup device includes a first element isolation region using an insulator and a second element isolation region using a pn junction, the first element isolation region and the second element isolation region being arranged in a region in which the plurality of pixels are arranged, and
a channel of the junction field-effect transistor and the second element isolation region is arranged along a line that is parallel to a channel direction of the junction field-effect transistor.

2. The solid-state image pickup device according to claim 1,
wherein a portion of the second element isolation region includes, and/or operates as, a drain region of the junction field-effect transistor, the junction field-effect transistor being of a lateral type.

3. The solid-state image pickup device according to claim 1,
wherein each pixel of the plurality of pixels further includes a reset transistor that resets an electric charge stored in a gate region of the junction field-effect transistor, and
wherein among a region between the junction field-effect transistor of at least one pixel of the plurality of pixels and a drain region of the reset transistor of at least one pixel of the plurality of pixels, a region between the photoelectric conversion section of at least one pixel of the plurality of pixels and the drain region of the reset transistor of at least one pixel of the plurality of pixels, and a region between the photoelectric conversion section of at least one pixel of the plurality of pixels and the junction field-effect transistor of at least one pixel of the plurality of pixels, one of the regions includes the first element isolation region formed therein and the other two of the regions each include the second element isolation region formed therein.

4. The solid-state image pickup device according to claim 3,
wherein the at least one second element isolation region is formed in the region between the junction field-effect transistor of at least one pixel of the plurality of pixels and the drain region of the reset transistor of at least one pixel of the plurality of pixels, and
wherein a channel region of the junction field-effect transistor of at least one pixel of the plurality of pixels and the drain region of the reset transistor of at least one pixel of the plurality of pixels are electrically connected to each other through the at least one second element isolation region.

5. The solid-state image pickup device according to claim 1,
wherein each of the plurality of pixels further includes a reset transistor that resets an electric charge stored in a gate region of the respective junction field-effect transistor, and
wherein among a region between the junction field-effect transistor of at least one pixel of the plurality of pixels and a drain region of the reset transistor of at least one pixel of the plurality of pixels, a region between the photoelectric conversion section of at least one pixel of the plurality of pixels and the drain region of the reset transistor of at least one pixel of the plurality of pixels, and a region between the photoelectric conversion section of at least one pixel of the plurality of pixels and the junction field-effect transistor of at least one pixel of the plurality of pixels, two of the regions include the first element isolation region formed therein and the other region includes the second element isolation region formed therein.

6. The solid-state image pickup device according to claim 5,
wherein the photoelectric conversion section of at least one pixel of the plurality of pixels is surrounded by the first element isolation region and an electrode that transfers the electric charge generated by the photoelectric conversion section of the at least one pixel of the plurality of pixels to the junction field-effect transistor of the at least one pixel of the plurality of pixels.

7. The solid-state image pickup device according to claim 1,
wherein each pixel of the plurality of pixels further includes a reset transistor that resets an electric charge stored in a gate region of the junction field-effect transistor,
wherein the first element isolation region is formed in each of: (i) a region between the junction field-effect transistor of at least one pixel of the plurality of pixels and a drain region of the reset transistor of at least one pixel of the plurality of pixels, (ii) a region between the photoelectric conversion section of at least one pixel of the plurality of pixels and the drain region of the reset transistor of at least one pixel of the plurality of pixels, and (iii) a region between the photoelectric conversion section of at least one pixel of the plurality of pixels and the junction field-effect transistor of at least one pixel of the plurality of pixels, and
wherein the second element isolation region is formed between the photoelectric conversion section of at least one pixel of the plurality of pixels and the photoelectric conversion section of a different pixel of the plurality of pixels neighboring each other.

8. A solid-state image pickup device comprising:
a plurality of pixels each including:
a photoelectric conversion section that generates an electric charge in accordance with incident light; and
a junction field-effect transistor that outputs an image signal in accordance with the electric charge generated by the photoelectric conversion section,
wherein the solid-state image pickup device includes a first element isolation region using an insulator and a second element isolation region using a pn junction, the first element isolation region and the second element isolation region being arranged in a region in which the plurality of pixels are arranged, and
a portion of the second element isolation region includes, and/or operates as, a drain region of the junction field-effect transistor, the junction field-effect transistor being of a lateral type.

9. The solid-state image pickup device according to claim 8,
wherein each pixel of the plurality of pixels further includes a reset transistor that resets an electric charge stored in a gate region of the junction field-effect transistor, and
wherein among a region between the junction field-effect transistor of at least one pixel of the plurality of pixels and a drain region of the reset transistor of at least one pixel of the plurality of pixels, a region between the photoelectric conversion section of at least one pixel of the plurality of pixels and the drain region of the reset transistor of at least one pixel of the plurality of pixels, and a region between the photoelectric conversion section of at least one pixel of the plurality of pixels and the junction field-effect transistor of at least one pixel of the plurality of pixels, one of the regions includes the first element isolation region formed therein and the other two of the regions each include the second element isolation region formed therein.

10. The solid-state image pickup device according to claim 9,
wherein the at least one second element isolation region is formed in the region between the junction field-effect transistor of at least one pixel of the plurality of pixels and the drain region of the reset transistor of at least one pixel of the plurality of pixels, and wherein a channel region of the junction field-effect transistor of at least one pixel of the plurality of pixels and the drain region of the reset transistor of at least one pixel of the plurality of pixels are electrically connected to each other through the at least one second element isolation region.

11. The solid-state image pickup device according to claim 8,
wherein each of the plurality of pixels further includes a reset transistor that resets an electric charge stored in a gate region of the respective junction field-effect transistor, and
wherein among a region between the junction field-effect transistor of at least one pixel of the plurality of pixels and a drain region of the reset transistor of at least one pixel of the plurality of pixels, a region between the photoelectric conversion section of at least one pixel of the plurality of pixels and the drain region of the reset transistor of at least one pixel of the plurality of pixels, and a region between the photoelectric conversion section of at least one pixel of the plurality of pixels and the junction field-effect transistor of at least one pixel of the plurality of pixels, two of the regions include the first element isolation region formed therein and the other region includes the second element isolation region formed therein.

12. The solid-state image pickup device according to claim 11,
wherein the photoelectric conversion section of at least one pixel of the plurality of pixels is surrounded by the first element isolation region and an electrode that transfers the electric charge generated by the photoelectric conversion section of the at least one pixel of the plurality of pixels to the junction field-effect transistor of the at least one pixel of the plurality of pixels.

13. The solid-state image pickup device according to claim 8,
wherein each pixel of the plurality of pixels further includes a reset transistor that resets an electric charge stored in a gate region of the junction field-effect transistor,
wherein the first element isolation region is formed in each of: (i) a region between the junction field-effect transistor of at least one pixel of the plurality of pixels and a drain region of the reset transistor of at least one pixel of the plurality of pixels, (ii) a region between the photoelectric conversion section of at least one pixel of the plurality of pixels and the drain region of the reset transistor of at least one pixel of the plurality of pixels, and (iii) a region between the photoelectric conversion section of at least one pixel of the plurality of pixels and the junction field-effect transistor of at least one pixel of the plurality of pixels, and
wherein the second element isolation region is formed between the photoelectric conversion section of at least one pixel of the plurality of pixels and the photoelectric conversion section of a different pixel of the plurality of pixels neighboring each other.

14. A solid-state image pickup device comprising:
a plurality of pixels each including:
a photoelectric conversion section that generates an electric charge in accordance with incident light; and
a junction field-effect transistor that outputs an image signal in accordance with the electric charge generated by the photoelectric conversion section,
wherein the solid-state image pickup device includes a first element isolation region using an insulator and a second element isolation region using a pn junction, the first element isolation region and the second element isolation region being arranged in a region in which the plurality of pixels are arranged, wherein each of the plurality of pixels further includes a reset transistor that resets an electric charge stored in a gate region of the respective junction field-effect transistor, and wherein among a region between the junction field-effect transistor of at least one pixel of the plurality of pixels and a drain region of the reset transistor of at least one pixel of the plurality of pixels, a region between the photoelectric conversion section of at least one pixel of the plurality of pixels and the drain region of the reset transistor of at least one pixel of the plurality of pixels, and a region between the photoelectric conversion section of at least one pixel of the plurality of pixels and the junction field-effect transistor of at least one pixel of the plurality of pixels, two of the regions include the first element isolation region formed therein and the other region includes the second element isolation region formed therein.

15. The solid-state image pickup device according to claim 14, wherein the photoelectric conversion section of at least one pixel of the plurality of pixels is surrounded by the first element isolation region and an electrode that transfers the electric charge generated by the photoelectric conversion section of the at least one pixel of the plurality of pixels to the junction field-effect transistor of the at least one pixel of the plurality of pixels.

\* \* \* \* \*